United States Patent
Mochizuki

(10) Patent No.: US 10,746,593 B2
(45) Date of Patent: Aug. 18, 2020

(54) WAVELENGTH MONITOR AND OPTICAL MODULE COMPRISING AN OPTICAL FILTER WITH A PERIODIC TRANSMITTANCE

(71) Applicant: MITSUBISHI ELECTRIC CORPORATION, Tokyo (JP)

(72) Inventor: Keita Mochizuki, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 114 days.

(21) Appl. No.: 16/088,381

(22) PCT Filed: May 12, 2016

(86) PCT No.: PCT/JP2016/064185
§ 371 (c)(1),
(2) Date: Sep. 25, 2018

(87) PCT Pub. No.: WO2017/195337
PCT Pub. Date: Nov. 16, 2017

(65) Prior Publication Data
US 2020/0232845 A1 Jul. 23, 2020

(51) Int. Cl.
*G01J 1/42* (2006.01)
*G01J 1/04* (2006.01)
(Continued)

(52) U.S. Cl.
CPC ............ *G01J 1/0488* (2013.01); *G01J 3/26* (2013.01); *G02B 6/4249* (2013.01); *H01S 5/0687* (2013.01)

(58) Field of Classification Search
CPC ...... G01J 1/0411; G01J 1/0414; G01J 1/0488; G01J 1/4257; H01S 5/0687
(Continued)

(56) References Cited

U.S. PATENT DOCUMENTS 6,801,553 B2 * 10/2004 Imaki ................ H01S 5/0687
372/29.02
6,915,035 B2   7/2005 Iwafuji
(Continued)

FOREIGN PATENT DOCUMENTS

| JP | 2002-185074 A | 6/2002 |
| JP | 2012-129259 A | 7/2012 |
| JP | 2015-35553 A | 2/2015 |

OTHER PUBLICATIONS

Mochizuki et al., "A Highly Stable Multi-beam Wavelength Monitor for Wavelength-stable Tunable Lasers", in Opto Electronics and Communications Conference (OECC), JThC. 25 (2015), total of 3 pages.

*Primary Examiner* — Que Tan Le
(74) *Attorney, Agent, or Firm* — Birch, Stewart, Kolasch & Birch, LLP

(57) ABSTRACT

A wavelength monitor includes: a wavelength tunable laser (1) having a plurality of emitting ports (10, 11), from which laser beams of the same wavelength are emitted; collimating lenses (20, 21), which are configured to collimate the laser beams emitted from the emitting ports (10, 11) to emit the collimated laser beams; an optical filter (4) having a periodic transmittance with respect to a frequency, on which the laser beams emitted from the collimating lenses (20, 21) are incident; and an optical detector (5) configured to receive the laser beams that have passed through the optical filter (4) to detect light intensities of the laser beams. In the wavelength monitor, the collimating lenses (20, 21) and the optical filter (4) are disposed so that the laser beams are incident on the optical filter (4) while a condition expressed as Equation (1) is satisfied.

16 Claims, 16 Drawing Sheets

(51) Int. Cl.
*G01J 3/26* (2006.01)
*H01S 5/0687* (2006.01)
*G02B 6/42* (2006.01)

(58) Field of Classification Search
USPC .................................................. 250/226, 216
See application file for complete search history.

(56) References Cited

U.S. PATENT DOCUMENTS

| | | |
|---|---|---|
| 8,395,765 B2 | 3/2013 | Mochizuki et al. |
| 2015/0043000 A1 | 2/2015 | Mochizuki |

\* cited by examiner

WAVELENGTH MONITOR AND OPTICAL MODULE COMPRISING AN OPTICAL FILTER WITH A PERIODIC TRANSMITTANCE

TECHNICAL FIELD

The present invention relates to a wavelength monitor and an optical module, and more particularly, to a wavelength monitor and an optical module including a wavelength tunable laser.

BACKGROUND ART

In recent years, in the field of optical communication, speed and capacity of an optical transmission system are increasing. As a core technology of the increases, a wavelength division multiplexing (WDM) system, in which light is multiplexed and transmitted with one optical fiber, is popular. Wavelength division multiplexing is hereinafter called "WDM". In this WDM system, in order to perform stable operation, as an insurance against an unexpected stop of a signal light source, it is required to secure an auxiliary signal light source having the same oscillation wavelength. Therefore, a maintenance cost is increased. In order to suppress this maintenance cost, there is an increased demand for a wavelength tunable light source with which a plurality of laser beams can be output from one signal light source.

As a representative wavelength tunable light source, there has been proposed a system in which a temperature of a semiconductor laser is changed to make an oscillation wavelength tunable. A tunable width of the oscillation wavelength of the semiconductor laser employing such system is determined by an operating temperature range, and is at most from about 2 nm to about 3 nm. Therefore, in order to increase a wavelength tunable width, a structure including a plurality of semiconductor lasers is often used.

It is required for the wavelength tunable light source to have a stable wavelength of an optical signal for a long period of time. Therefore, there has been developed alight source having a function of a wavelength monitor configured to monitor emitted light from a semiconductor laser. As a representative related technology regarding the wavelength monitor of the wavelength tunable light source, there is proposed the structure in which a portion of light is extracted, by a beam splitter or the like, from light emitted from a front surface of the semiconductor laser to be output to an optical fiber, and the extracted light is allowed to enter an optical filter formed of an etalon (see Patent Literature 1, for example).

It is also proposed, in a wavelength monitor configured to monitor wavelengths of laser beams emitted from two or more semiconductor lasers, which are formed in parallel on a semiconductor substrate, to dispose emitted light positions of the semiconductor lasers at unequal intervals. In the wavelength monitor, emitted light emitted from the semiconductor lasers in a direction of a rear surface of the semiconductor substrate is allowed to enter an optical filter formed of an etalon (see Patent Literature 2, for example).

There is further proposed, in order to relax amounting accuracy of an optical filter, the structure in which two laser beams are allowed to enter an optical filter formed of an etalon at symmetrically positive and negative angles (see Patent Literature 3, for example).

Citation List
Patent Literature
 [PTL 1] JP 2002-185074 A
 [PTL 2] JP 2012-129259 A
 [PTL 3] JP 2015-35553 A

SUMMARY OF INVENTION

Technical Problem

As described above, in each of Patent Literatures 1 to 3, an etalon is used as the optical filter. The etalon used as the optical filter in the wavelength monitor in this manner is changed in transmission characteristic depending on an incident angle of a beam. Therefore, in order to obtain a desired transmission characteristic, there is a problem in that highly accurate mounting angle alignment is required. As described in Patent Literature 3, the structure in which the two laser beams are allowed to enter the etalon at the symmetrically positive and negative angles can suppress a variation in etalon transmission characteristic caused by a variation in mounting angle of the etalon, and thus provide a method for solving the above-mentioned problem. However, in this related-art method, the two laser beams reflected on a surface of the etalon travel at angles that are the same as incident angles of the laser beams. Therefore, there is a problem in that the laser beams may disadvantageously re-enter a semiconductor laser through a lens that is disposed to collimate the emitted light from the semiconductor laser. This phenomenon is generally called "back reflection light". The back reflection light destabilizes an operating state of the semiconductor laser, and hence is required to be avoided as much as possible. As a method for solving this problem, it is conceivable to insert an isolator, which is an optical element having a different transmittance depending on a direction in which light travels, between the semiconductor laser and the etalon. However, in that case, the isolator being an extra part is required, and the entire device is inevitably increased in size and cost.

The present invention has been made to solve the above-mentioned problems, and therefore has an object to provide a wavelength monitor and an optical module, in which a plurality of laser beams are allowed to enter an optical filter at the same time to suppress a variation in transmission characteristic of the optical filter, to thereby relax a mounting accuracy of the optical filter, and suppress the effect of back reflection light.

Solution to Problem

According to one embodiment of the present invention, there is provided a wavelength monitor, including: a wavelength tunable laser having a plurality of emitting ports, from which laser beams of the same wavelength are emitted; a collimating lens, which is configured to collimate the laser beams emitted from the plurality of emitting ports of the wavelength tunable laser to emit the collimated laser beams; an optical filter having a periodic transmittance with respect to a frequency of incident light, on which the laser beams emitted from the collimating lens are incident; and an optical detector configured to receive the laser beams that have passed through the optical filter to detect light intensities of the laser beams, in which the collimating lens and the optical filter are disposed so as to satisfy a condition that a value on the left side of Equation (1), which is to be described later, falls within a preset range, where m represents a number of each of the laser beams that are incident on the optical filter, n represents a refractive index of the optical filter, d represents a length of the optical filter, R represents a power reflectance of reflective films formed on both ends of the optical filter, $E_m$ represents an electric field intensity ratio of the m-th laser beam, $\theta_m$ represents an incident angle of the m-th laser beam on the optical filter, $c_0$ represents a speed of light in vacuum, and f represents an optical frequency of each of the laser beams.

Advantageous Effects of Invention

According to the wavelength monitor of the present invention, in the wavelength monitor in which the plurality of laser beams are allowed to enter the optical filter at the same time, the collimating lens and the optical filter are disposed such that the laser beams are incident on the optical filter so as to satisfy the condition that the value on the left side of Equation (1), which is to be described later, falls within the preset range, with the result that the variation in transmission characteristic of the optical filter can be suppressed, the mounting accuracy of the optical filter can be relaxed, and the effect of the back reflection light can be suppressed.

DESCRIPTION OF EMBODIMENTS

First Embodiment

Figure 1:
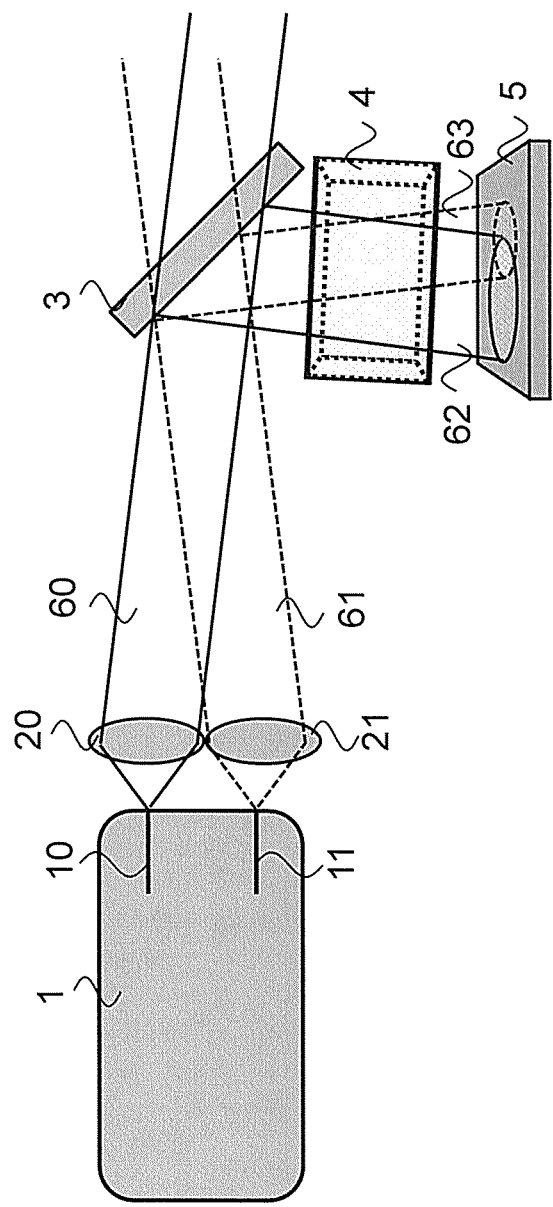
FIG. 1 is a configuration diagram for illustrating configurations of a wavelength monitor according to a first embodiment of the present invention and an optical module using the wavelength monitor.

FIG. 1 is a configuration diagram for illustrating configurations of a wavelength monitor according to a first embodiment of the present invention and an optical module using the wavelength monitor.

As illustrated in FIG. 1, the wavelength monitor according to the first embodiment includes a wavelength tunable laser 1, collimating lenses 20 and 21, an optical filter 4, and an optical detector 5.

Moreover, the optical module according to the first embodiment includes the wavelength monitor described above and a beam splitter 3. The beam splitter 3 is configured to split an input light beam to introduce a portion of the light beam obtained as a result of the splitting to the wavelength monitor, and output the other light beam as output of the optical module. In other words, the optical module according to the first embodiment is a light source having a function of the wavelength monitor configured to monitor emitted light from the wavelength tunable laser 1. The optical module according to the first embodiment takes a portion of the emitted light from the wavelength tunable laser 1 to monitor the portion with the wavelength monitor, and hence can check whether or not a wavelength of an optical signal is stable for a long period of time.

Now, components forming the wavelength monitor and the optical module are described.

The wavelength tunable laser 1 includes two emitting ports 10 and 11, from which light beams of the same wavelength are emitted. The wavelength tunable laser 1 can freely change the wavelength of the emitted light. Therefore, the wavelength tunable laser 1 emits light of a desired wavelength set by a user. In this case, the number of emitting ports of the wavelength tunable laser 1 is two. However, the present invention is not limited thereto, and three or more emitting ports may be provided.

On the collimating lenses 20 and 21, divergent light beams emitted from the emitting ports 10 and 11 of the wavelength tunable laser 1 are incident, respectively. The collimating lenses 20 and 21 collimate the divergent light beams and output the collimated light beams. The term "to collimate" means to convert the divergent light beams into parallel light beams. Those parallel light beams are hereinafter referred to as "collimated beams". In the first embodiment, the number of collimating lenses is the same as the number of emitting ports of the wavelength tunable laser 1.

On the beam splitter 3, the collimated beams emitted from the collimating lenses 20 and 21 are incident. The beam splitter 3 is configured to split a portion of each of the collimated beams to the optical filter 4.

The optical filter 4 is formed of a material having a wavelength-dependent transmittance, for example, an etalon. Therefore, the optical filter 4 has a periodic transmittance with respect to a frequency of an incident laser beam. The optical filter 4 is disposed such that a plurality of laser beams are allowed to enter from the beam splitter 3. The optical filter 4 is hereinafter referred to as "etalon 4".

The optical detector 5 is configured to receive the light beams that have passed through the etalon 4 to detect light intensities of the light beams.

In FIG. 1, paths 60 and 61 of the light beams emitted from the two emitting ports 10 and 11, and light beams 62 and 63 obtained as a result of the splitting by the beam splitter 3 are conceptually illustrated as an example.

In the first embodiment, the collimating lenses 20 and 21 and the etalon 4 are disposed such that the light beams 62 and 63 obtained as a result of passing through the collimating lenses 20 and 21 and being split by the beam splitter 3 are incident on the etalon 4 so as to satisfy the following Equation (1).

$$\sum_m \frac{f \times E_m^2 \times \sin 2\theta_m \times (n^2 - \sin^2\theta_m)^{-1/2} \times \sin(4\pi df/c_0 \times (n^2 - \sin^2\theta_m)^{1/2})}{((1-R)^2 + 4R \times \sin^2(2\pi df/c_0 \times (n^2 - \sin^2\theta_m)^{1/2}))^2} \approx 0$$
$$2E_m^2 \times (n^2 - \sin^2\theta_m)^{1/2} \times$$
$$\sum_m \frac{\sin(4\pi df/c_0 \times (n^2 - \sin^2\theta_m)^{1/2})}{((1-R)^2 + 4R \times \sin^2(2\pi df/c_0 \times (n^2 - \sin^2\theta_m)^{1/2}))^2}$$

$$\forall 1 \varepsilon m, |\theta_1| > 0.5° \qquad (2)$$

$$\forall 1, k \varepsilon m, ||\theta_1| - \theta_k|| > 0.5° \qquad (3)$$

In Equation (1), m represents the number of each of the laser beams that are incident on the etalon 4. In the first embodiment, m takes two values: 0 and 1. Moreover, n represents a refractive index of the etalon 4, d represents a length of the etalon 4, R represents a power reflectance of reflective films formed on both ends of the etalon 4, $E_m$ represents an electric field intensity ratio of the m-th laser beam, $\theta_m$ represents an incident angle of the m-th laser beam on the etalon 4, $c_0$ represents a speed of light in vacuum, and f represents an optical frequency of each of the laser beams that are emitted from the wavelength tunable laser 1. The phrase "length d of the etalon 4" as used herein refers to a length of the etalon 4 along a direction in which the laser beams travel, and the phrase "power reflectance R of the reflective films formed on the both ends of the etalon 4" refers to a power reflectance of a reflective film formed on an entrance end of the etalon 4, on which the laser beams are incident, and a reflective film formed on an exit end of the etalon 4, from which the laser beams are emitted.

To satisfy Equation (1) means that a value on the left side of Equation (1) matches 0. When the collimating lenses 20 and 21 and the etalon 4 are disposed so as to satisfy Equation (1), the effect of back reflection light can naturally be suppressed.

Next, operation of the wavelength monitor according to the first embodiment of the present invention is described.

As illustrated in FIG. 1, the light beams emitted from the emitting ports 10 and 11 of the wavelength tunable laser 1 are collimated by the collimating lenses 20 and 21. The collimated beams emitted from the collimating lenses 20 and 21 are split by the beam splitter 3, and the light beams 62 and 63, which are a portion of the collimated beams, are incident on the etalon 4. The light beams 62 and 63 pass through the etalon 4, and then are incident on the optical detector 5. The optical detector 5 detects light intensities of the light beams 62 and 63.

The etalon 4 has the periodic frequency-dependent transmittance, and hence the light intensities detected by the optical detector 5 depend on frequencies of the light beams 62 and 63 emitted from the etalon 4. Therefore, when a relationship between the light intensity detected by the optical detector 5 and the frequency of the light beam is previously known, the light intensities detected by the optical detector 5 may be observed to monitor wavelengths of the light beams (=speeds of light/frequencies of the light beams) emitted from the wavelength tunable laser 1.

Therefore, in the first embodiment, as described above, the collimating lenses 20 and 21 and the etalon 4 are disposed such that the light beams 62 and 63 obtained as a result of passing through the collimating lenses 20 and 21 and being split by the beam splitter 3 are incident on the etalon 4 so as to satisfy Equation (1) . As a result, it is possible to suppress the effect of a variation in mounting angle of the etalon 4 on the monitored wavelength characteristic observed by the optical detector 5.

Figure 2:
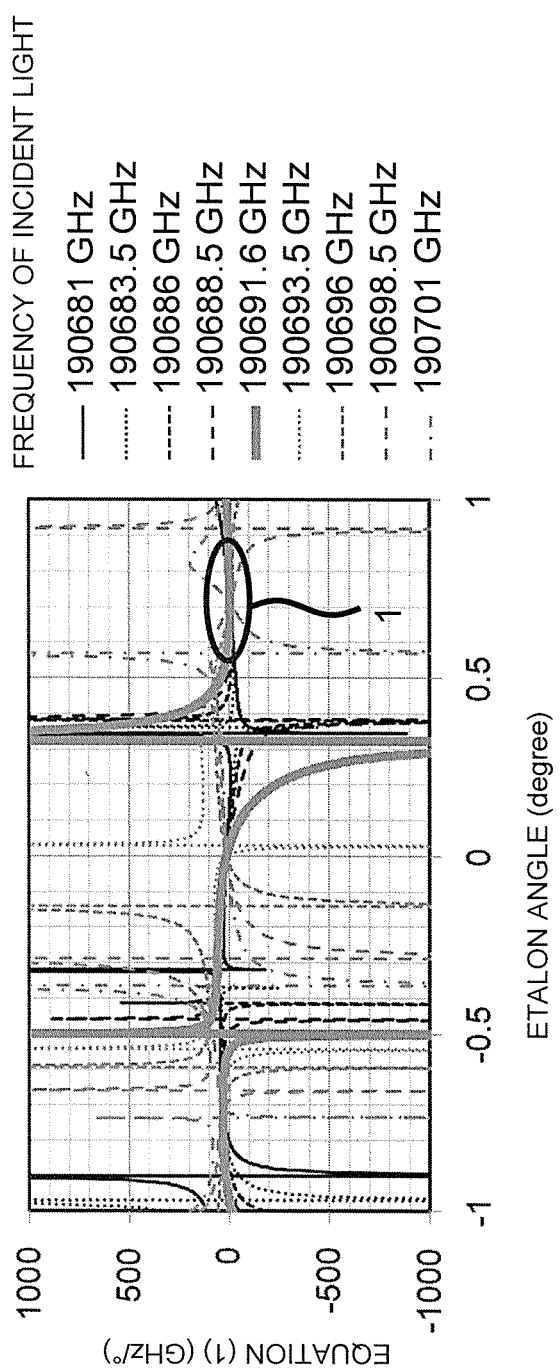
FIG. 2 is a graph for showing a relationship between an etalon angle in the wavelength monitor according to the first embodiment of the present invention and Equation (1).

A calculation example is shown for the effects of the first embodiment. In FIG. 2, there is shown a result of calculating a relationship between an etalon angle and the value on the left side of Equation (1) at the time when values of parameters are set as described below in <Example 1>. In FIG. 2, the horizontal axis indicates the etalon angle (degree) , and the vertical axis indicates the value on the left side of Equation (1)(GHz/°). In FIG. 2, the value on the left side of Equation (1) is calculated for nine optical frequencies in a range of from 190,681 GHz to 190,701 GHz . The nine frequencies are merely examples, and the number of optical frequencies is not particularly limited. The term "etalon angle" as used herein refers to a mounting angle of the etalon 4, and the mounting angle of the etalon 4 at the time when the laser beams of m=0 and 1 are incident on the etalon 4 at symmetrically positive and negative angles is set to 0°.

<Example 1>m=0 and 1, n≈1.5, d≈2 mm, R=0.18, $E_0^2$=0.31, $E_1^2$=0.69, and $\theta_m = (-1)^m \times 1.43° + \theta_{etalon}$, where $\theta_{etalon}$ represents an etalon angle of the etalon 4.

It has been described above that the value on the left side of Equation (1) matches 0, but it is practically difficult that the value completely matches 0. Therefore, in the first embodiment, as a condition in which amounting accuracy of the etalon 4 is relaxed, a margin is allowed before and after 0 to set an allowable range of from −5 GHz/° to 5 GHz/°. Therefore, in the first embodiment, as the condition in which the mounting accuracy of the etalon 4 is relaxed, a condition that the value on the left side of Equation (1) falls within the range of from −5 GHz/° to 5 GHz/° is set. This condition is hereinafter referred to as "condition of Equation (1)".

Of the nine results shown in the graph of FIG. 2, for the calculation result of the optical frequency of 190,691.6 GHz, in Region 1, in which the etalon angle $\theta_{etalon}$ is in a range of from 0.6° to 0.93°, the value on the left side of Equation (1) falls within the range of from −5 GHz/° to 5 GHz/°, and satisfies the condition of Equation (1).

Figure 3:
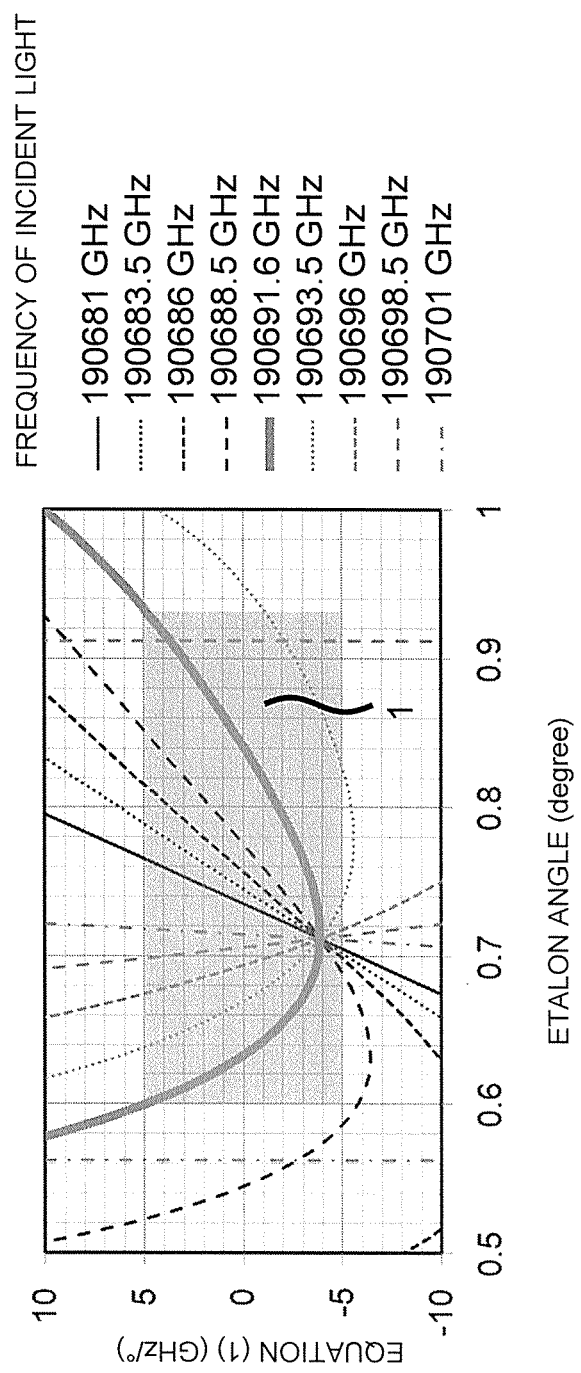
FIG. 3 is a partially enlarged graph of FIG. 2.

FIG. 3 is an enlarged graph of Region 1 of FIG. 2. In FIG. 3, the horizontal axis indicates the etalon angle (degree), and the vertical axis indicates the value on the left side of Equation (1)(GHz/°). A region filled with a dark color in FIG. 3 corresponds to Region 1 of FIG. 2. As shown in FIG. 3, for the calculation result of the optical frequency of 190,691.6 GHz, the value on the left side of Equation (1) falls within the range of from −5 GHz/° to 5 GHz/° in the range in which the etalon angle is from 0.6° to 0.93°.

Figure 4:
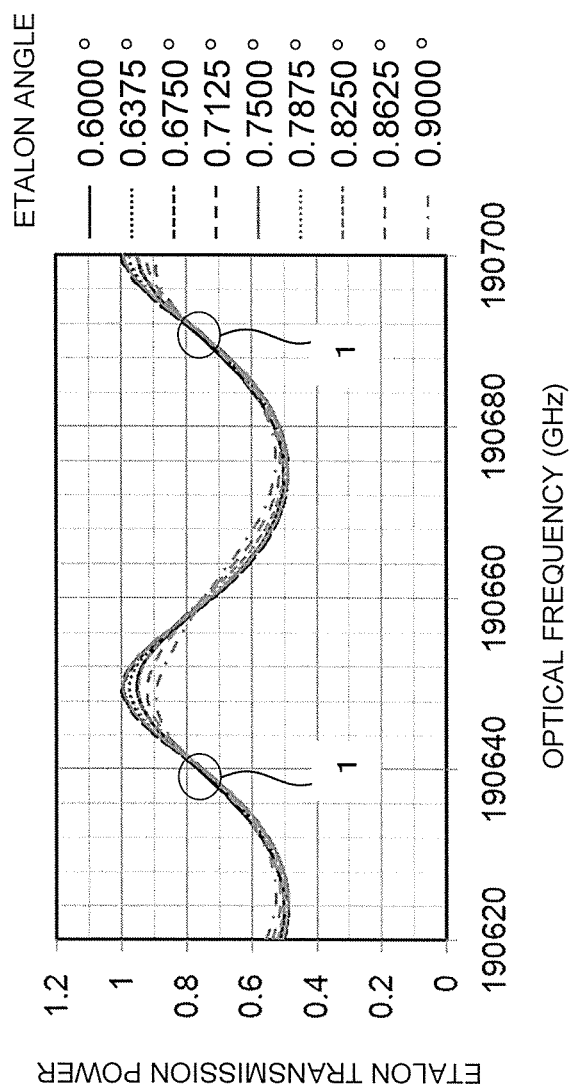
FIG. 4 is an explanatory graph for showing etalon transmission characteristics in the wavelength monitor according to the first embodiment of the present invention.
Figure 5:
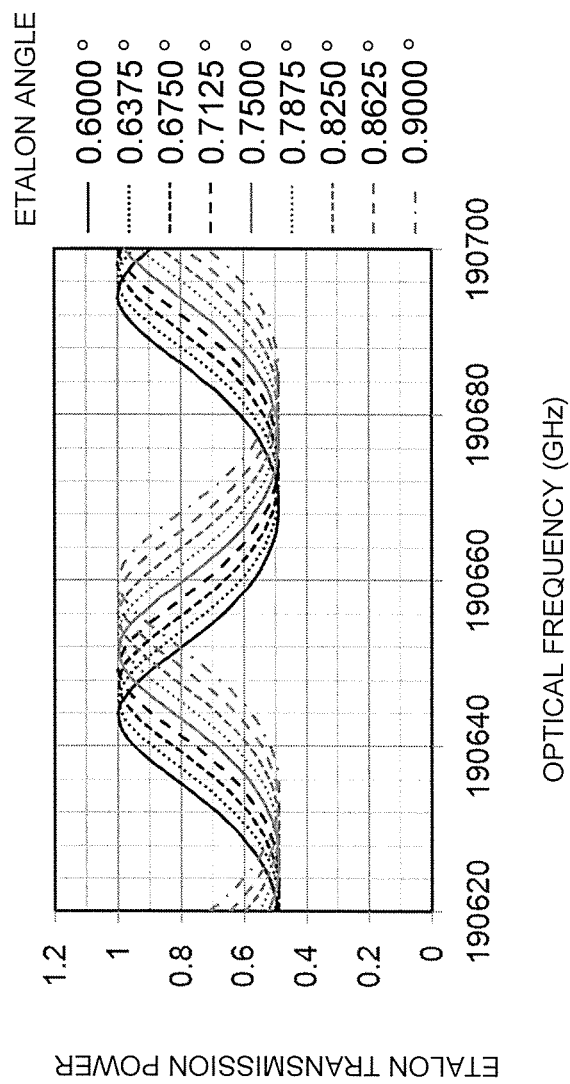
FIG. 5 is an explanatory graph for showing etalon transmission characteristics in a related-art wavelength monitor for comparison with FIG. 4.

Moreover, etalon transmission characteristics obtained by combining characteristics of two light beams under the condition of Region 1 are shown in FIG. 4. Moreover, for reference, etalon transmission characteristics in the related art obtained when only one light beam is used are shown in FIG. 5.

In FIG. 4, a portion indicated by Circle 1 is a portion satisfying Equation (1). When FIG. 4 is compared with the related-art example of FIG. 5, it can be seen that a variation in etalon transmission power with respect to the change in etalon angle is suppressed in FIG. 4.

In the first embodiment, the condition that the value on the left side of Equation (1) falls within the range of from −5

GHz/° to 5 GHz/° is set, and a basis for deriving the range is described below. When an etalon transmittance is expressed as I(f,θ), the following Equation (4) is established.

$$\frac{dI(f, \theta)}{d\theta} \times \Delta\theta_{etalon} \le \frac{dI(f, \theta)}{df} \times \Delta f_{monitor} \quad (4)$$

In Equation (4), $\Delta\theta_{etalon}$ represents an allowable mounting deviation angle range of the etalon 4 to be compensated for, and $\Delta f_{monitor}$ represents a target accuracy of the wavelength monitor. The phrase "target accuracy of the wavelength monitor" as used herein refers to wavelength monitoring accuracy required of the wavelength monitor, that is, required reading accuracy required by the user. Moreover, the phrase "allowable mounting deviation angle range of the etalon 4" refers to an allowable change width of the incident angles of the plurality of laser beams emitted from the wavelength tunable laser 1 on the etalon 4. When Equation (4) is modified, the following Equation (5) is obtained, and Equation (1) corresponds to the left side of Equation (5). Therefore, the value on the left side of Equation (1) is equal to or less than a value obtained by dividing the target accuracy $\Delta f_{monitor}$ of the wavelength monitor by an allowable change width $\Delta\theta_{etalon}$ of the incident angles of the laser beams on the etalon 4.

$$\frac{dI(f, \theta)/d\theta}{dI(f, \theta)/df} \le \frac{\Delta f_{monitor}}{\Delta\theta_{etalon}} \quad (5)$$

In the first embodiment, it is assumed that the target accuracy of the wavelength monitor is ±0.05 GHz, and that the mounting deviation of the etalon 4 to be suppressed is 0.01°. Therefore, in the first embodiment, in order to satisfy those conditions, the allowable range of the value on the left side of Equation (1) is set to the range of from −5 GHz/° to 5 GHz/°.

The other effects are described below. First, in the first embodiment, the etalon incident angle $\theta_m$ of the m-th incident light beam on the etalon 4 is calculated as follows.

First, the calculation is performed for the 0th incident light beam. Now, with the etalon angle $\theta_{etalon}$ being from 0.6° to 0.93°, when $\theta_{etalon}$=0.6° and $\theta_{etalon}$=0.93° are each substituted into $\theta_m=(-1)^m\times1.43°+\theta_{etalon}$, the following results are obtained:

$\theta_0=(-1)^0\times1.43+0.6=2.03$; and
$\theta_0=(-1)^0\times1.43+0.93=2.36$.

Similarly, the calculation is performed for the 1st incident light beam. When $\theta_{etalon}$=0.6° and $\theta_{etalon}$=0.93° are each substituted into $\theta_m=(-1)^m\times1.43°+\theta_{etalon}$, the following results are obtained:

$\theta_1=(-1)^1\times1.43+0.6=-0.83$; and
$\theta_1=(-1)^1\times1.43+0.93=-0.5$.

As can be seen, in FIG. 3, the 0th light beam has an etalon incident angle of from 2.03° to 2.36°, the 1st light beam has an etalon incident angle of from −0.5° to −0.83°, and absolute values exceed 0.5° in both cases. This can be seen from Equation (2) above. Therefore, an angle formed by an incident light beam of each of the light beams and a reflected light beam obtained by the incident light beam being reflected on the surface of the etalon 4 is 1.0° or more, and the back reflection light can be sufficiently suppressed to 50 dB or less. Moreover, an angle formed by the incident light beam of the 0th light beam and the reflected light beam of the 1st light beam, and an angle formed by the incident light beam of the 1st light beam and the reflected light beam of the 0th light beam are each 1.20° or more. Therefore, the back reflection light to the emitting ports on the opposite side can be sufficiently suppressed. Moreover, when a difference between the absolute values of the etalon incident angles $\theta_m$ of the light beams is determined, and an absolute value of the difference is taken, the value exceeds 0.5°. In the first embodiment, the number of light beams is two, but also when the number of light beams is three or more, the absolute value of the difference between the absolute values of the etalon incident angles $\theta_m$ of the light beams exceeds 0.5° for all combination of any two light beams. This can be seen from Equation (3) above. As a result, destabilization of an oscillation mode of a semiconductor laser by the back reflection light can be suppressed.

It should be noted that there is no need to limit the numerical values, shapes, materials, and positional relationship in the wavelength tunable laser 1, the collimating lenses 20 and 21, the beam splitter 3, the etalon 4, and the optical detector 5 to the values described in the first embodiment. For example, as the material of the etalon 4, a glass material, for example, a crystal etalon or a quartz etalon, is assumed, and the refractive index is set as n=1.5. However, the present invention is not limited thereto. The optical filter for use as the etalon 4 is only required to be a filter having the frequency-dependent periodic transmittance. Therefore, an optical filter formed of a resonator formed on a Si, GaAs, or InP semiconductor substrate, a ferroelectric material, for example, LiNbO3, or a polymer or glass substrate may be used instead of the etalon 4, for example.

Moreover, in the first embodiment, the number of light beams emitted by the wavelength tunable laser is two, but similar effects can be obtained also when the number of light beams is three or four, or even a larger number as long as the conditions of Equations (1) to (3) are satisfied. Therefore, the number of light beams may be any number.

Moreover, the definitions of the etalon length d, the power reflectance R, the electric field intensity $E_m$ of the incident light beam, the light beam incident angle $\theta_m$, the allowable range for Equation (1), and the like may be appropriately set as required.

Moreover, in the first embodiment, the light beams obtained by splitting the two emitted light beams from the emitting ports 10 and 11 of the wavelength tunable laser 1 by the beam splitter 3 are incident on the etalon 4, but the present invention is not limited thereto. For example, when the emitting ports 10 and 11 of the wavelength tunable laser 1 are "first emitting ports", in addition to the first emitting ports, a second emitting port may be separately provided to the wavelength tunable laser 1, and an emitted light beam from the second emitting port may be introduced to the output of the optical module. A wavelength of the laser beam emitted from the second emitting port is the same as the wavelength of the laser beams emitted from the first emitting ports. When the second emitting port is provided, the emitted light beams emitted from the emitting ports 10 and 11 are not required to be split by the beam splitter 3. In other words, the emitted light beams from the emitting ports 10 and 11 are allowed to enter the etalon 4 directly from the collimating lenses 20 and 21. The number of second emitting ports may be any number.

As described above, in the wavelength monitor and the optical module according to the first embodiment, the two laser beams are allowed to enter the optical filter at the same time to suppress the variation in transmission characteristic of the etalon 4 caused by the variation in mounting angle of the etalon 4, and thus the mounting accuracy of the etalon 4 is relaxed. Moreover, in the first embodiment, the collimating lenses 20 and 21 and the etalon 4 are disposed so as to satisfy the condition that the value on the left side of Equation (1) falls within the range of from −5 GHz/° to 5 GHz/°, and thus the effect of the back reflection light is suppressed. Therefore, there is no need to dispose an extra part, for example, an isolator for suppressing the effect of the back reflection light, and hence the increases in size and cost of the entire device can be prevented.

Second Embodiment

A second embodiment of the present invention is a modification example of the first embodiment, and has a feature that, in addition to Equations (1) to (3) above, Equation (6) below is also added to the conditions. In other words, in the second embodiment, there are conditions that the value on the left side of Equation (1) falls within the range of from −5 GHz/° to 5 GHz/°, and that a left side of Equation (6) is 0.02 or more.

$$\left| \sum_m \frac{8\pi dR(1-R)^2 \times E_m^2 \times (n^2 - \sin^2\theta_m)^{1/2} \times \sin(4\pi df/c_0 \times (n^2 - \sin^2\theta_m)^{1/2})}{c_0 \times ((1-R)^2 + 4R \times \sin^2(2\pi df/c_0 \times (n^2 - \sin^2\theta_m)^{1/2}))^2} \right| \geq 0.02 \quad (6)$$

Figure 6:
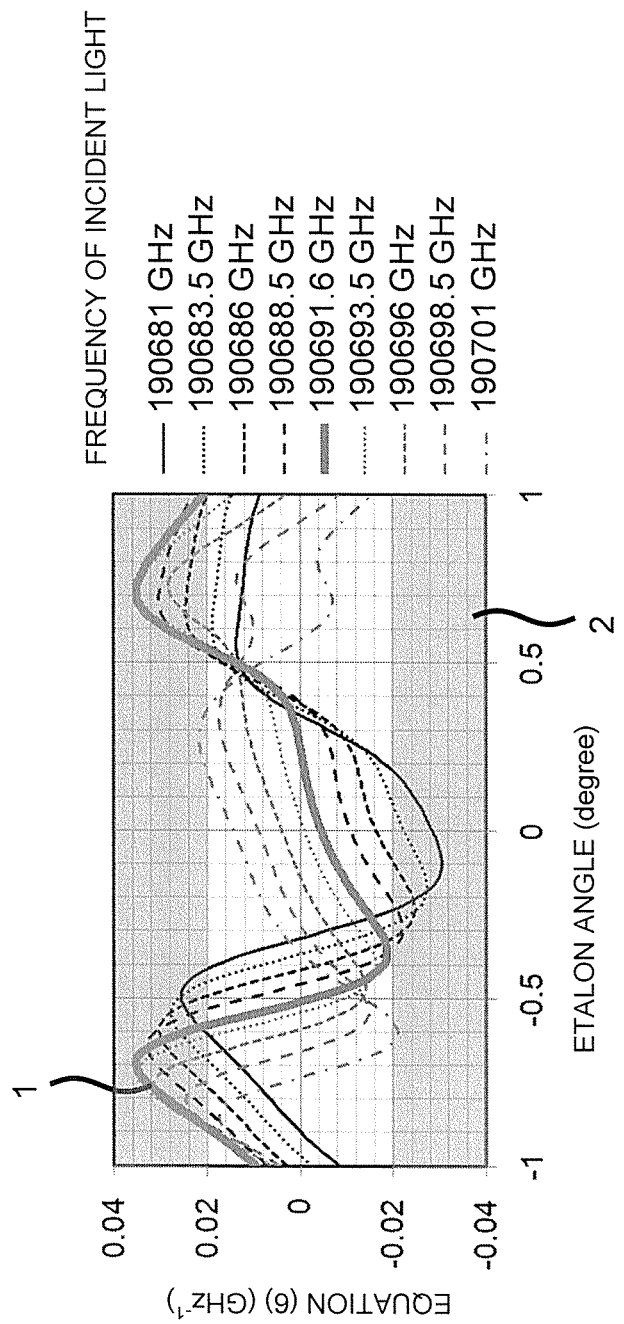
FIG. 6 is a graph for showing a relationship between an etalon angle in a wavelength monitor according to a second embodiment of the present invention and Equation (6).
Figure 7:
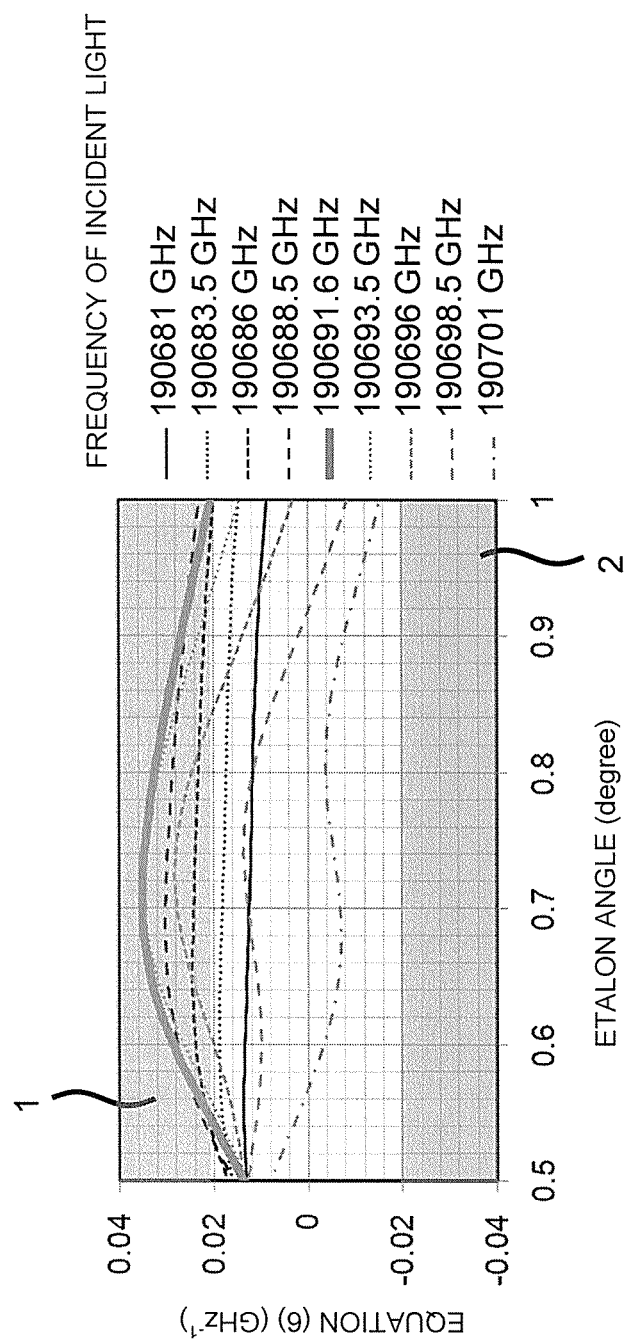
FIG. 7 is an enlarged graph of FIG. 6.

In Equation (6), definitions of variables are the same as in the first embodiment. In order to describe the effects of the second embodiment, calculation results at a time when Equation (6) is satisfied, and calculation results at a time when Equation (6) is not satisfied are compared to each other. In FIG. 6 and FIG. 7, there is shown angle dependence of the value on the left side of Equation (6) in a case where the parameters are set as described above in <Example 1> described in the first embodiment. In FIG. 6 and FIG. 7, the vertical axis indicates the value on the left side of Equation (6) (GHz$^{-1}$), and the horizontal axis indicates the etalon angle (degree). Moreover, FIG. 7 is an enlarged graph of FIG. 6. It should be noted that in FIG. 6, the etalon angle on the horizontal axis shows a range of from −1 to 1, but in FIG. 7, the etalon angle on the horizontal axis shows a range of from 0.5 to 1. The vertical axis in each of FIG. 6 and FIG. 7 shows a range of from −0.04 to 0.04.

Of the graphs of FIG. 6 and FIG. 7, Regions 1 and 2 filled with a dark color are regions satisfying Equation (6). As shown in FIG. 6 and FIG. 7, it can be seen that, in the range of etalon angles of from 0.6° to 0.93° for the optical frequency of 190,691.6 GHz described in the first embodiment, the condition of Equation (6) is satisfied. In other words, in the case where the parameters are set as described above in <Example 1> described in the first embodiment, the conditions of Equations (1) to (3) and Equation (6) are satisfied in the range of etalon angles of from 0.6° to 0.93° for the optical frequency of 190,691.6 GHz.

Figure 8:
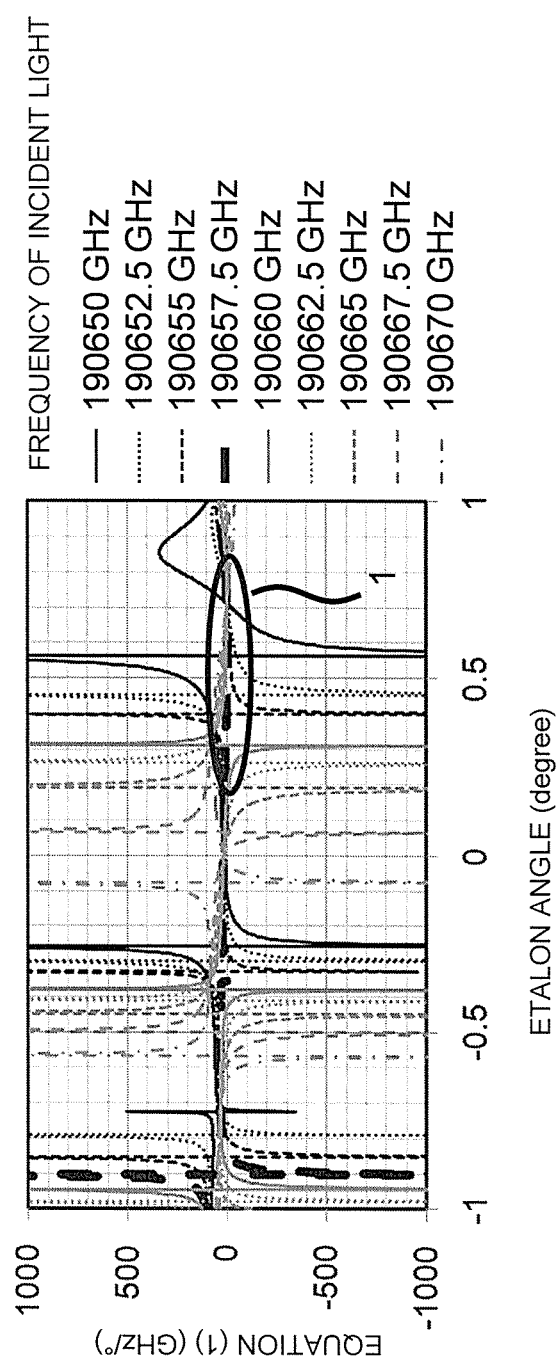
FIG. 8 is a graph for showing a relationship between an etalon angle in a comparative example for comparison with the second embodiment of the present invention and Equation (1).

In contrast, for comparison, an example in which Equations (1) to (3) in the first embodiment are satisfied but Equation (6) is not satisfied is shown in FIG. 8. In FIG. 8, there is shown a result of calculating a relationship between an etalon angle and the value on the left side of Equation (1) when the values of the parameters are set as described below in <Example 2>. In FIG. 8, the horizontal axis indicates the etalon angle (degree), and the vertical axis indicates the value on the left side of Equation (1)(GHz/°). In FIG. 8, the value on the left side of Equation (1) is calculated for a plurality of optical frequencies in a range of from 190,650 GHz to 190,670 GHz.

<Example 2> m=0 and 1, n≈1.5, d≈2 mm, R=0.02, $E_0^2$=0.27, $E_1^2$=0.73, and $\theta_m$=(−1)$^m$×1.43°+$\theta_{etalon}$, where $\theta_{etalon}$ represents the etalon angle of the etalon 4.

Figure 9:
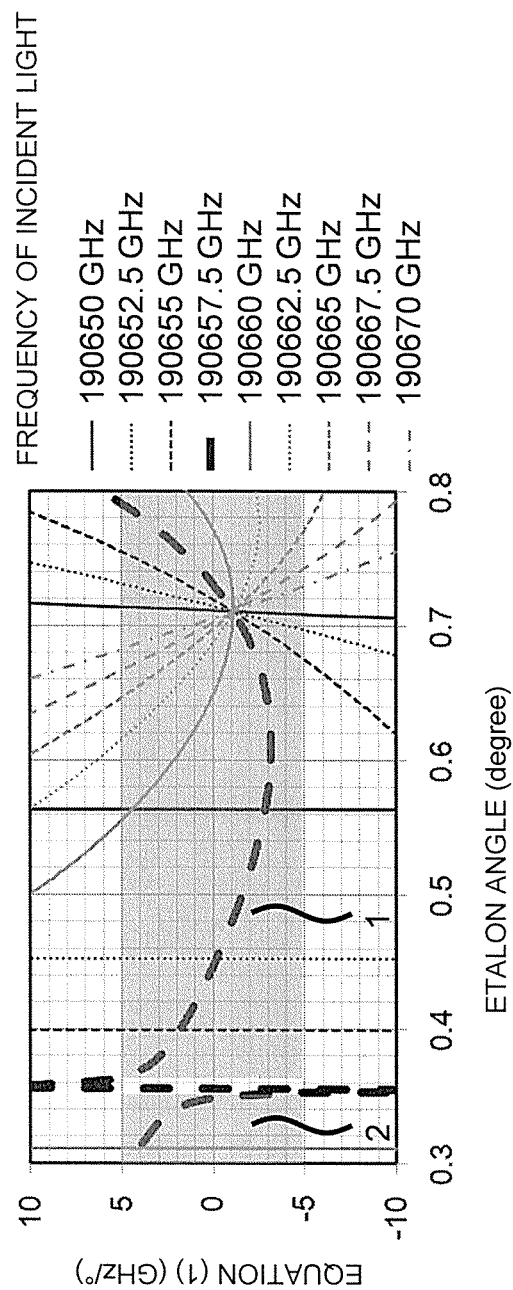
FIG. 9 is a partially enlarged graph of FIG. 8.

FIG. 9 is an enlarged graph of Region 1 of FIG. 8. In FIG. 9, the horizontal axis indicates the etalon angle (degree), and the vertical axis indicates the value on the left side of Equation (1)(GHz/°). A region filled with a dark color in FIG. 9 corresponds to Region 1 of FIG. 8.

Figure 10:
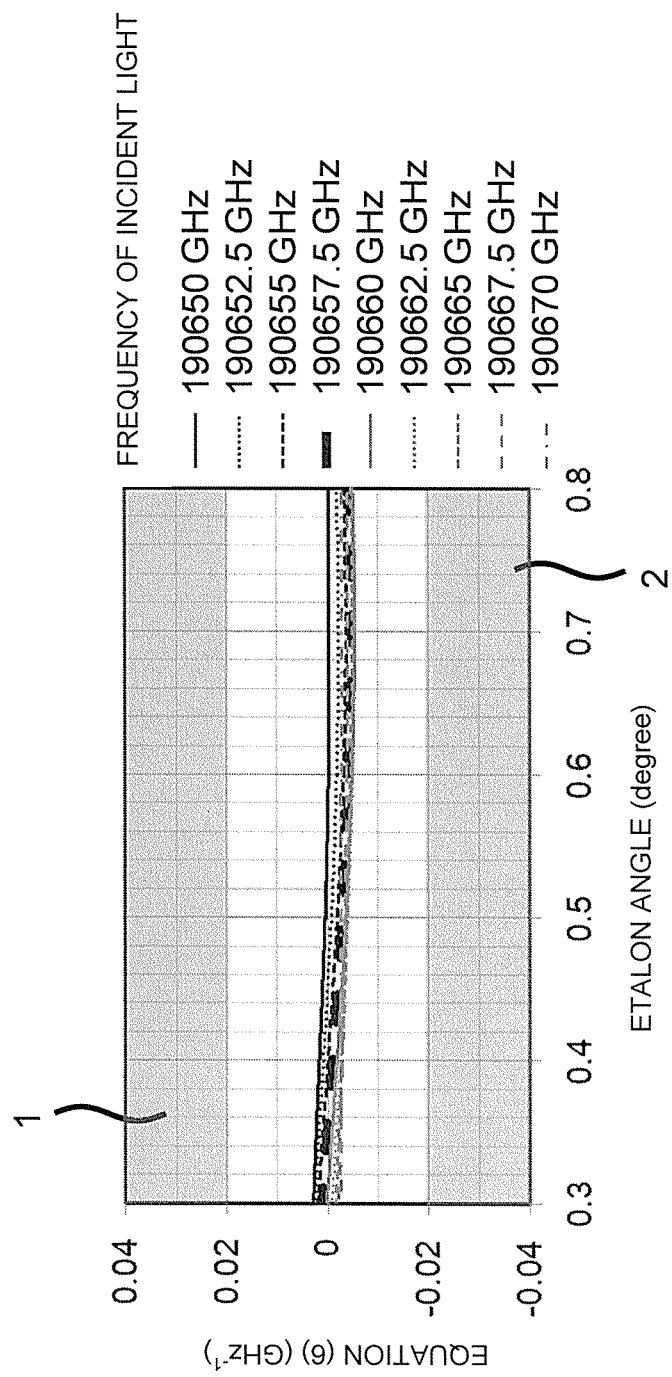
FIG. 10 is a graph for showing a relationship between the etalon angle in the wavelength monitor according to the second embodiment of the present invention and Equation (6).

Region 2 of etalon angles of from 0.30° to 0.35° for the optical frequency of 190,657.5 GHz and Region 1 of etalon angles of from 0.36° to 0.80° for the same optical frequency shown in the graphs of FIG. 8 and FIG. 9 satisfy the condition that the value of Equation (1) falls within the range of from −5 GHz/° to 5 GHz/°. This condition is a condition for relaxing the mounting accuracy of the etalon 4. Meanwhile, the angle dependence of the left side of Equation (6) at this time is shown in FIG. 10. In FIG. 10, the horizontal axis indicates the etalon angle (degree), and the vertical axis indicates the value on the left side of Equation (6) (GHz$^{-1}$).

Figure 11:
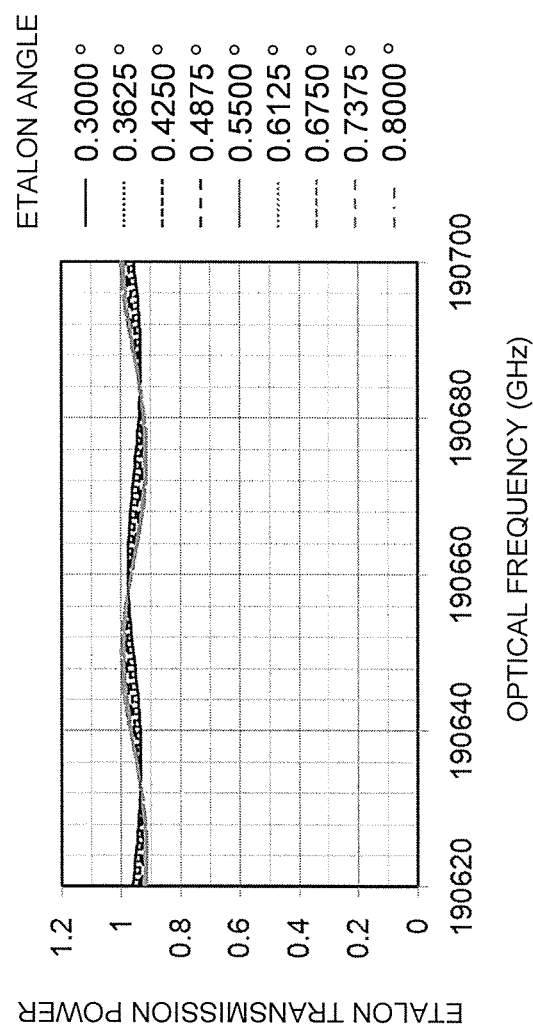
FIG. 11 is a graph for showing etalon transmission characteristics obtained by combining characteristics of two light beams in the wavelength monitor according to the second embodiment of the present invention.
Figure 12:
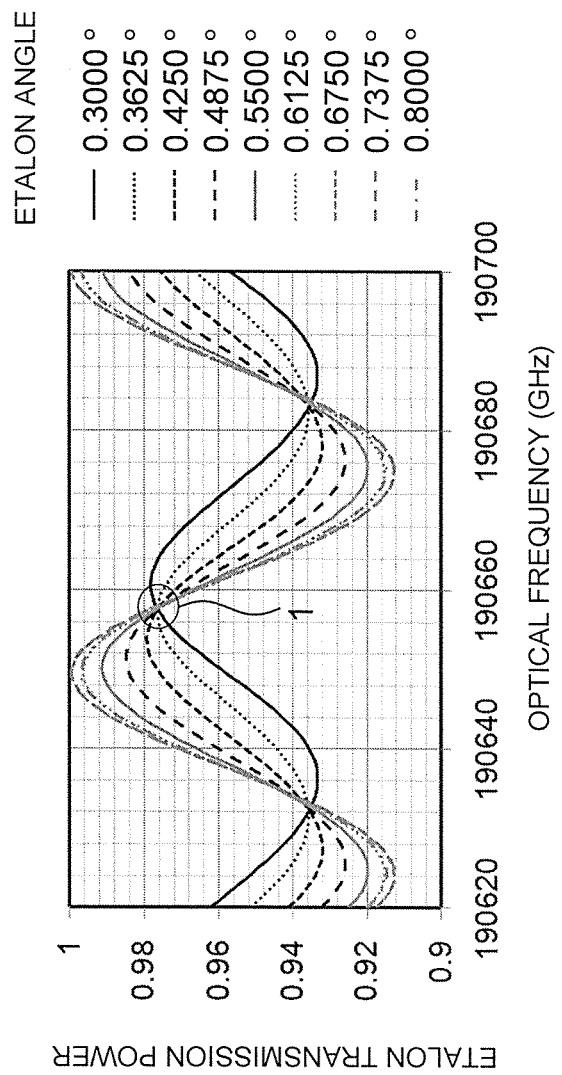
FIG. 12 is a partially enlarged graph of FIG. 11.

In the graph of FIG. 10, Regions 1 and 2 filled with a dark color are regions satisfying Equation (6). Of etalon angles of from 0.30° to 0.35° and from 0.36° to 0.80° for the optical frequency of 190,657.5 GHz shown in the second embodiment, no angle satisfies the condition of Equation (6). Etalon transmission characteristics obtained by combining characteristics of two light beams in <Example 2> are shown in FIG. 11 and FIG. 12. FIG. 12 is an enlarged graph of FIG. 11.

In FIG. 12, a portion indicated by Circle 1 is a portion satisfying Equation (1). When FIG. 12 is compared with the related-art example of FIG. 5, it can be seen that a variation in etalon transmission power with respect to the change in etalon angle is suppressed in FIG. 12. However, when focusing attention on optical frequency dependency of the etalon transmission power, the slope is significantly changed for the optical frequencies in Circle 1. In order to detect the wavelength, it is required to convert a variation in optical frequency into a variation in etalon transmission power. Therefore, when the slope of the etalon transmission power spectrum is small, sufficient wavelength detection accuracy cannot be obtained. There is no etalon angle condition with which sufficient wavelength detection accuracy is obtained in FIG. 12, and this coincides with the condition of Equation (6) described in the second embodiment.

As described above, also in the second embodiment, effects similar to those of the first embodiment described above can be obtained. Further, in the second embodiment, the collimating lenses 20 and 21 and the etalon 4 are disposed such that, in addition to Equations (1) to (3), Equation (6) is also satisfied. Therefore, the slope of the etalon transmission power spectrum for the optical frequencies at which the variation in etalon transmission power with respect to the etalon angle can be suppressed can be increased to a level at which sufficient wavelength detection accuracy can be obtained.

Third Embodiment

Figure 13:
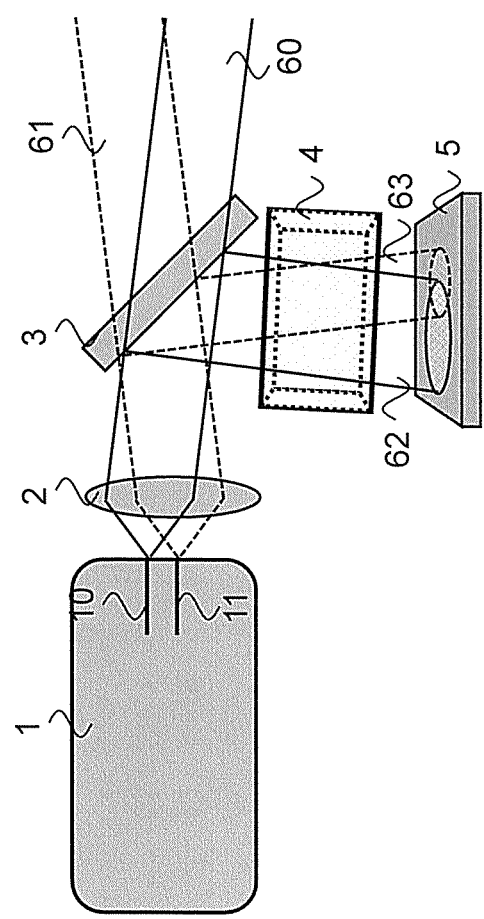
FIG. 13 is a configuration diagram for illustrating a configuration of a wavelength monitor according to a third embodiment of the present invention.

In FIG. 13, configurations of a wavelength monitor according to a third embodiment of the present invention and an optical module using the wavelength monitor are illustrated. The third embodiment is a modification example of Embodiments 1 and 2. In Embodiments 1 and 2, the two collimating lenses 20 and 21 are provided, but in the third embodiment, one collimating lens 2 is provided as illustrated in FIG. 13. The other components are basically the same as those of Embodiments 1 and 2, and hence a description thereof is omitted here.

The collimating lens 2 is configured to convert each of the divergent light beams emitted from the two emitting ports 10 and 11 of the wavelength tunable laser 1 into a parallel light beam. A diameter of the collimating lens 2 is sufficiently larger than a distance between the emitting port 10 and the emitting port 11. Therefore, a plurality of divergent light beams can be converted into the parallel light beams at the same time with one collimating lens.

In the third embodiment, a size of the collimating lens is selected in this manner as appropriate to use one collimating lens. Moreover, in Embodiments 1 and 2, the distance between the emitting ports 10 and 11 cannot be sufficiently reduced with physical interference between the two collimating lenses 20 and 21 being a bottleneck, but in the third embodiment, the distance between the emitting ports 10 and 11 can be reduced with the above-mentioned bottleneck factor being eliminated. As a result, the wavelength tunable laser 1 can be downsized and reduced in cost. Therefore, the wavelength monitor and the optical module can also be downsized and reduced in cost.

As described above, also in the third embodiment, effects similar to those of Embodiments 1 and 2 can be obtained. Moreover, in the third embodiment, the number of collimating lenses is one, and hence there is no physical interference between the collimating lenses. As a result, the distance between the emitting ports 10 and 11 can be reduced, and the wavelength monitor and the optical module can be downsized and reduced in cost.

The third embodiment is also applicable to any configuration of the first embodiment and the second embodiment.

Fourth Embodiment

Figure 14:
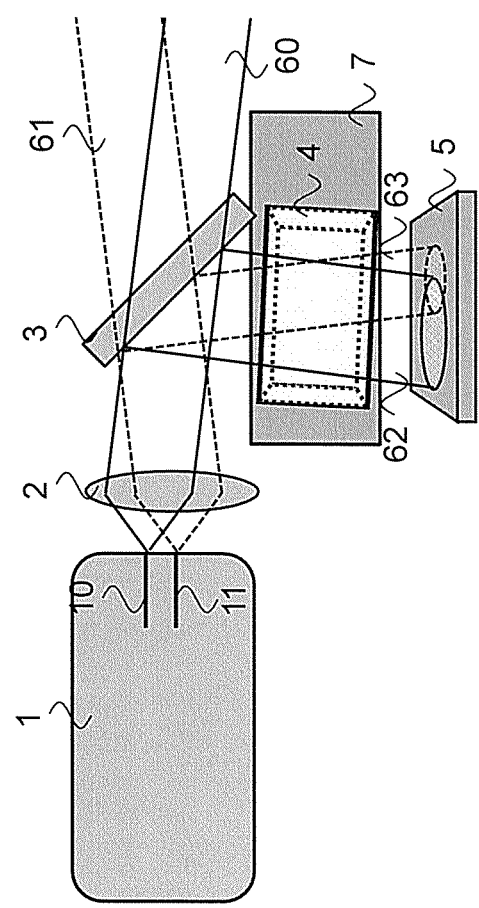
FIG. 14 is a configuration diagram for illustrating a configuration of a wavelength monitor according to a fourth embodiment of the present invention.

In FIG. 14, configurations of a wavelength monitor according to a fourth embodiment of the present invention and an optical module using the wavelength monitor are illustrated. The fourth embodiment is a modification example of Embodiments 1, 2, and 3. In the fourth embodiment, the etalon 4 is disposed on a temperature adjuster 7 as illustrated in FIG. 14. This is a difference from Embodiments 1, 2, and 3. The other components are basically the same as those of Embodiments 1, 2, and 3, and hence a description thereof is omitted here.

The temperature adjuster 7 is a device for adjusting a temperature, which is represented by a thermo-electric cooler (TEC) or other such Peltier device, for example. The temperature adjuster 7 can absorb heat generated from the etalon 4 and disperse the heat into air, and hence can maintain a temperature of the etalon 4 at a suitable value. The etalon 4 is known to be varied in thermooptic effect of the refractive index with a change in temperature, and to be varied in transmission characteristic with expansion and contraction due to a linear expansion coefficient. In the fourth embodiment, the temperature adjuster 7 is provided to the etalon 4, and hence the temperature of the etalon 4 can be maintained at a constant value, with the result that the variations in thermooptic effect and transmission characteristic of the etalon 4 can be prevented.

In Embodiments 1 and 2, an optical frequency at which the variation in etalon transmission power with the etalon angle can be suppressed cannot be determined freely. However, an optical frequency actually used in optical communication is an integral multiple of 50 GHz (which may be 100 GHz, 32.5 GHz, or 6.25 GHz depending on the standards). In this manner, in actual use, it is required to adapt, to the above-mentioned optical frequency, the optical frequency at which the variation in etalon transmission power with the etalon angle can be suppressed. In Embodiment 4, the etalon temperature is adjusted with the temperature adjuster 7 to shift the etalon transmission power characteristic in an optical frequency direction, and hence the optical frequency can be optimally adjusted.

As described above, also in Embodiment 4, effects similar to those of Embodiments 1 to 3 can be obtained. Further, in the fourth embodiment, the temperature of the etalon 4 is adjusted with the temperature adjuster 7, and hence the etalon transmission power characteristic can be shifted in the optical frequency direction, and the optical frequency can be optimally adjusted.

In FIG. 14, there is illustrated the example in which the temperature adjuster 7 in the fourth embodiment is applied to the configuration of the third embodiment. However, the present invention is not limited thereto, and the fourth embodiment is also applicable to any configuration of Embodiments 1 and 2.

Fifth Embodiment

Figure 15:
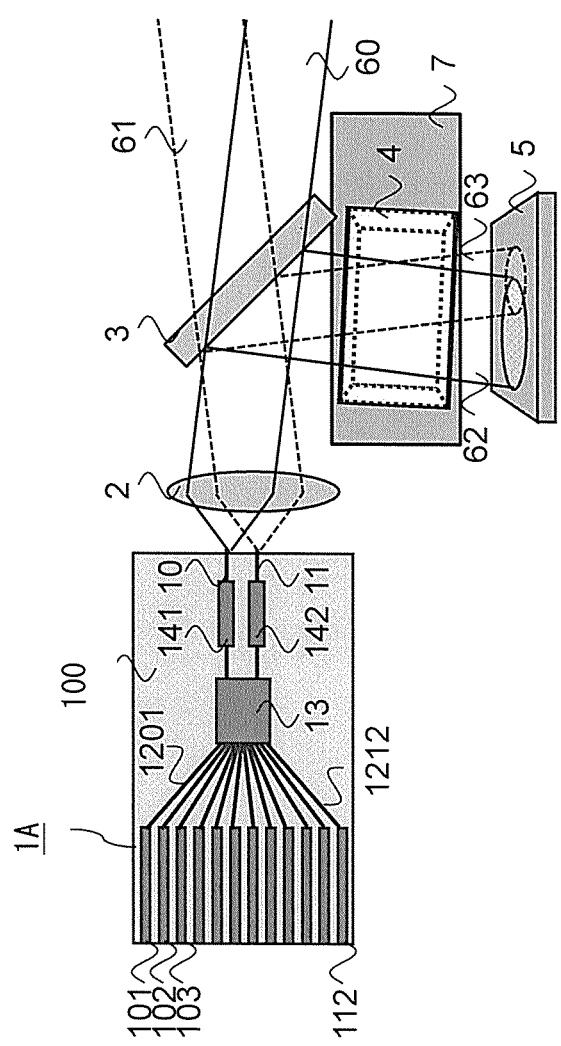
FIG. 15 is a configuration diagram for illustrating a configuration of a wavelength monitor according to a fifth embodiment of the present invention.

In FIG. 15, configurations of a wavelength monitor according to a fifth embodiment of the present invention and an optical module using the wavelength monitor are illustrated. The fifth embodiment is a modification example of Embodiments 1 to 4. In the fifth embodiment, a wavelength tunable laser 1A of a semiconductor laser array type is disposed instead of the wavelength tunable laser 1 described in Embodiments 1 to 4. This is a difference from Embodiments 1 to 4. The other components are basically the same as those of Embodiments 1 to 4, and hence a description thereof is omitted here.

As illustrated in FIG. 15, the wavelength tunable laser 1A includes a semiconductor substrate 100, a plurality of semiconductor lasers 101 to 112, optical waveguides 1201 to 1212, an optical multiplexer/demultiplexer 13, optical amplifiers 141 and 142, and the emitting ports 10 and 11.

The plurality of semiconductor lasers 101 to 112 are formed on the semiconductor substrate 100. As illustrated in FIG. 15, the semiconductor lasers 101 to 112 are disposed in parallel in the stated order toward one array direction. The array direction is a direction perpendicular to a direction in which the semiconductor lasers 101 to 112 emit light beams. Moreover, those semiconductor lasers 101 to 112 are disposed at constant intervals. Therefore, a gap of a constant distance is provided between adjacent two semiconductor lasers. Meanwhile, the optical detector 5 has a rectangular shape. Specifically, the optical detector 5 has a shape of a rectangle. The optical detector 5 is disposed such that a longitudinal direction of the optical detector 5 corresponds to the array direction of the semiconductor lasers 101 to 112. The semiconductor lasers 101 to 112 emit light beams of the same wavelength. In the example of FIG. 15, the number of semiconductor lasers 101 to 112 is twelve, but may be any number. Moreover, a wavelength of a laser beam emitted from each of the semiconductor lasers 101 to 112 is tunable.

The optical waveguides 1201 to 1212 are optically connected to the semiconductor lasers 101 to 112. The optical waveguides 1201 to 1212 propagate the light beams emitted from the semiconductor lasers 101 to 112. In the example of FIG. 15, the number of optical waveguides 1201 to 1212 is twelve, but may be any number.

The optical multiplexer/demultiplexer 13 is optically connected to the optical waveguides 1201 to 1212. The optical multiplexer/demultiplexer 13 is configured to multiplex/demultiplex twelve light beams that have been propagated through the optical waveguides 1201 to 1212 to correspond to the number of emitting ports 10 and 11. In this example, the number of emitting ports 10 and 11 is two, and hence the optical multiplexer/demultiplexer 13 multiplexes/demultiplexes twelve light beams that have been propagated through the optical waveguides 1201 to 1212 into two light beams. The optical multiplexer/demultiplexer 13 is formed of a 12×2 multi mode interferometer (MMI), for example.

The optical amplifiers 141 and 142 are optically connected between the optical multiplexer/demultiplexer 13 and the emitting ports 10 and 11. The optical amplifiers 141 and 142 amplify intensities of the two light beams emitted from the optical multiplexer/demultiplexer 13, and allow the amplified light beams to enter the emitting ports 10 and 11. Each of the optical amplifiers 141 and 142 is formed of a semiconductor optical amplifier (SOA), for example.

The emitting ports 10 and 11 emit the light beams that have been allowed to enter from the optical amplifiers 141 and 142 toward the collimating lens 2. In this manner, also in the fifth embodiment, the emitting ports 10 and 11 emit two light beams of the same wavelength as in Embodiments 1 to 4.

Next, operation of the wavelength tunable laser 1A is described. First, the plurality of semiconductor lasers 101 to 112 emit light beams of the same wavelength, respectively. Next, the optical waveguides 1201 to 1212 propagate the light beams emitted from the semiconductor lasers 101 to 112 to the optical multiplexer/demultiplexer 13. The optical multiplexer/demultiplexer 13 multiplexes/demultiplexes the twelve light beams that have been propagated through the optical waveguides 1201 to 1212 into two light beams, and allows the two light beams to enter the optical amplifiers 141 and 142. The optical amplifiers 141 and 142 amplify intensities of the two light beams emitted from the optical multiplexer/demultiplexer 13, and allow the amplified light beams to enter the emitting ports 10 and 11. The emitting ports 10 and 11 emit the light beams toward the collimating lens 2.

Next, effects of the fifth embodiment are described. In the fifth embodiment, the above-mentioned laser of the semiconductor laser array type is used as the wavelength tunable laser. Therefore, the same level of output power can be obtained with power consumption that is substantially the same as that of a normal wavelength tunable laser with one emitting port. This is because of the operation principle of the optical multiplexer/demultiplexer 13. This is because structures of a 12×1 MMI, which is applied to the normal wavelength tunable laser with the one emitting port, and the 12×2 MMI, which is applied to the wavelength tunable laser with the two emitting ports in the fifth embodiment, are similar to a 12×12 MMI. In the 12×12 MMI, emitted light beams are divided to have a power that is 1/12th of incident light beams. In the 12×1 MMI, one of the emitted light beams is coupled to an emitting waveguide, and in the 12×2 MMI, two of the emitted light beams is coupled to emitting waveguides. Therefore, with this structure, even when the number of emitting ports is increased, output power similar to that in the case where the number of emitting ports is one can be obtained. It should be noted, however, that an optical amplifier is required for each emitting port, and hence when the number of emitting ports is increased, power consumption is increased in accordance with the number of optical amplifiers.

As described above, also in the fifth embodiment, effects similar to those of Embodiments 1 to 4 can be obtained. Moreover, in the fifth embodiment, the laser of the semiconductor laser array type is used as the wavelength tunable laser, and hence output power equivalent to that of the normal wavelength tunable laser with the one emitting port can be obtained with the power consumption that is substantially the same as that of the normal wavelength tunable laser.

In the fifth embodiment, the twelve semiconductor lasers are disposed on the semiconductor substrate 100, but the number of semiconductor lasers may be less than 12, for example, 4 or 8, or may be more than 12.

Further, in FIG. 15, there is illustrated the example in which the wavelength tunable laser 1A in the fifth embodiment is applied to the configuration of the fourth embodiment. However, the present invention is not limited thereto, and the wavelength tunable laser 1A in Embodiment 5 is also applicable to any configuration of Embodiments 1 to 3.

Moreover, in FIG. 15, the example in which one optical detector 5 is disposed is illustrated. However, the present invention is not limited thereto, and the optical detector 5 may consist of at least two optical detectors. In that case, those optical detectors are disposed in a line to correspond to the array direction of the semiconductor lasers 101 to 112. Alternatively, those optical detectors may be disposed in an array to correspond to the array direction of the semiconductor lasers 101 to 112.

Embodiment 6

Figure 16:
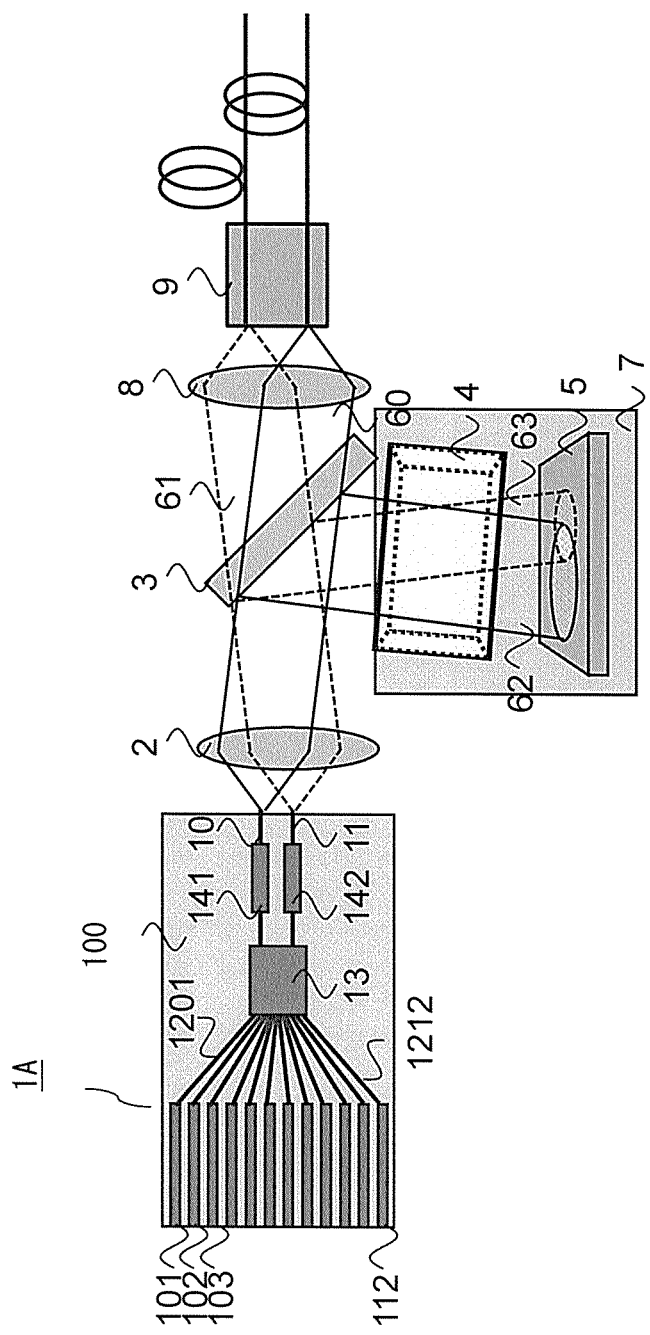
FIG. 16 is a configuration diagram for illustrating a configuration of a wavelength monitor according to a sixth embodiment of the present invention.

In FIG. 16, configurations of a wavelength monitor according to Embodiment 6 of the present invention and an optical module using the wavelength monitor are illustrated. Embodiment 6 is a modification example of Embodiments 1 to 5.

As illustrated in FIG. 16, the wavelength monitor according to Embodiment 6 includes the wavelength tunable laser 1A, the collimating lens 2, the optical filter 4, the optical detector 5, and a temperature adjuster 7A.

Moreover, as illustrated in FIG. 16, the optical module according to Embodiment 6 includes the above-mentioned wavelength monitor, the beam splitter 3, a condenser lens 8, and an optical fiber portion 9.

The configuration of the wavelength tunable laser 1A has been described in the fifth embodiment, and hence a description thereof is omitted here. Moreover, the collimating lens 2 has been described in the third embodiment, and hence a description thereof is omitted here. Moreover, the beam splitter 3, the optical filter 4, and the optical detector 5 have been described in the first embodiment, and hence a description thereof is omitted here.

The temperature adjuster 7A is formed of a thermoelectric cooler (TEC) or other such Peltier device, for example. The temperature adjuster 7A is provided to the etalon 4 and the optical detector 5. In Embodiment 6, the temperature adjuster 7A is provided to the etalon 4 and the optical detector 5, with the result that temperatures of the etalon 4 and the optical detector 5 can be maintained to a constant value.

The condenser lens 8 is disposed in a subsequent stage of the beam splitter 3. On the condenser lens 8, a portion of light obtained as a result of the splitting by the beam splitter 3 is incident. The incident light is parallel light beams emitted from the collimating lens 2. The condenser lens 8 condenses the incident parallel light beams.

The optical fiber portion 9 includes at least two core portions, and optical fibers connected to the core portions. The core portions of the optical fiber portion 9 are optically coupled to the two emitting ports 10 and 11 of the semiconductor substrate 100. On the optical fiber portion 9, the laser beams from the emitting ports 10 and 11 are incident through the collimating lens 2, the beam splitter 3, and the condenser lens 8. The optical fiber portion 9 splits the incident laser beams into two or more optical fibers on the way.

In Embodiment 6, the above-mentioned configuration is adopted. Therefore, one optical module can serve as two optical modules, for example, a signal light source and a local oscillation light source, that have been required otherwise in the related art, with the result that downsizing and a reduction in cost of the entire system can be achieved.

As described above, also in Embodiment 6, effects similar to those of the fifth embodiment can be obtained. Moreover, in Embodiment 6, the condenser lens 8 and the optical fiber portion 9 are provided in the subsequent stage of the beam splitter 3. Therefore, one optical module can serve as the two optical modules that have been required otherwise in the related art, with the result that the downsizing and the reduction in cost of the entire system can be achieved.

The example in which Embodiment 6 is applied to the configuration of the fifth embodiment has been described here as an example. However, the present invention is not limited thereto, and Embodiment 6 is applicable to any configuration of Embodiments 1 to 4.

The invention claimed is:

1. A wavelength monitor, comprising:
    a wavelength tunable laser having a plurality of emitting ports, from which laser beams of the same wavelength are emitted;
    a collimating lens to collimate the laser beams emitted from the plurality of emitting ports of the wavelength tunable laser to emit the collimated laser beams;
    an optical filter having a periodic transmittance with respect to a frequency of incident light, on which the laser beams emitted from the collimating lens are incident; and
    an optical detector to receive the laser beams that have passed through the optical filter to detect light intensities of the laser beams,
    wherein the collimating lens and the optical filter are disposed so as to satisfy a condition that a value of the following Equation 1 falls within a predetermined range:

$$\frac{f \times E_m^2 \times \sin 2\theta_m \times (n^2 - \sin^2\theta_m)^{-1/2} \times}{2E_m^2 \times (n^2 - \sin^2\theta_m)^{1/2} \times} \sum_m \frac{\sin(4\pi df/c_0 \times (n^2 - \sin^2\theta_m)^{1/2})}{((1-R)^2 + 4R \times \sin^2(2\pi df/c_0 \times (n^2 - \sin^2\theta_m)^{1/2}))^2}}{\sum_m \frac{\sin(4\pi df/c_0 \times (n^2 - \sin^2\theta_m)^{1/2})}{((1-R)^2 + 4R \times \sin^2(2\pi df/c_0 \times (n^2 - \sin^2\theta_m)^{1/2}))^2}}, \quad (1)$$

where m represents a number of each of the laser beams that are incident on the optical filter, n represents a refractive index of the optical filter, d represents a length of the optical filter, R represents a power reflectance of reflective films formed on both ends of the optical filter, $E_m$ represents an electric field intensity ratio of the m-th laser beam, $\theta_m$ represents an incident angle of the m-th laser beam on the optical filter, $c_0$ represents a speed of light in vacuum, and f represents an optical frequency of each of the laser beams.

2. The wavelength monitor according to claim 1, wherein the laser beams emitted from the plurality of emitting ports of the wavelength tunable laser are incident on the optical filter at angles having absolute values that are all 0.5° or more.

3. The wavelength monitor according to claim 1, wherein the laser beams emitted from the plurality of emitting ports of the wavelength tunable laser are incident on the optical filter at angles having absolute values that have a difference having an absolute value of 0.5° or more for all combinations of any two laser beams.

4. The wavelength monitor according to claim 1, wherein the predetermined range, which is set for the value of the Equation 1, is set to a range of equal to or less than a value obtained by dividing a target accuracy of the wavelength monitor by an allowable change width of an incident angle of each of the laser beams on the optical filter.

5. The wavelength monitor according to claim 1, wherein the laser beams are incident on the optical filter so as to satisfy a condition expressed as the following Equation 2:

$$\left| \sum_m \frac{8\pi dR(1-R)^2 \times E_m^2 \times (n^2 - \sin^2\theta_m)^{1/2} \times \sin(4\pi df/c_0 \times (n^2 - \sin^2\theta_m)^{1/2})}{c_0 \times ((1-R)^2 + 4R \times \sin^2(2\pi df/c_0 \times (n^2 - \sin^2\theta_m)^{1/2}))^2} \right| \geq 0.02. \quad (2)$$

6. The wavelength monitor according to claim 1, wherein the collimating lens consists of a plurality of collimating lenses.

7. The wavelength monitor according to claim 1,
    wherein the collimating lens consists of one collimating lens, and
    wherein the collimating lens has a diameter that is larger than a distance between the plurality of emitting ports of the wavelength tunable laser.

8. The wavelength monitor according to claim 1, further comprising a temperature adjuster, which is provided to the optical filter, and is configured to adjust a temperature of the optical filter.

9. The wavelength monitor according to claim 1, wherein the wavelength tunable laser includes:
    a semiconductor substrate;
    a plurality of semiconductor lasers, which are disposed on the semiconductor substrate, and are configured to emit laser beams of the same wavelength;
    an optical multiplexer/demultiplexer, which is disposed on the semiconductor substrate, and is configured to multiplex/demultiplex the laser beams emitted from the plurality of semiconductor lasers to correspond to the number of the plurality of emitting ports; and
    an optical amplifier configured to amplify the laser beams emitted from the optical multiplexer/demultiplexer to allow the amplified laser beams to enter the plurality of emitting ports.

10. The wavelength monitor according to claim 9,
    wherein the optical detector has a rectangular shape, and
    wherein the optical detector is disposed so that a longitudinal direction of the optical detector corresponds to an array direction of the plurality of semiconductor lasers.

11. The wavelength monitor according to claim 9, wherein the optical detector consists of at least two optical detectors, and the at least two optical detectors are disposed so as to correspond to an array direction of the plurality of semiconductor lasers.

12. The wavelength monitor according to claim 1, wherein the optical filter consists of a quartz etalon.

13. The wavelength monitor according to claim 1, wherein the optical filter consists of a crystal etalon.

14. An optical module, comprising:
the wavelength monitor according to claim 1; and
a beam splitter configured to split each of the laser beams emitted from the wavelength monitor,
wherein, of the laser beams split by the beam splitter, one laser beam is introduced to the wavelength monitor, and another laser beam is output to an outside as output from the optical module.

15. The optical module according to claim 14, further comprising:
a condenser lens configured to condense the another laser beam obtained as a result of the splitting by the beam splitter; and
an optical fiber portion, which includes at least two optical fibers, and is configured to split the laser beams condensed by the condenser lens to the at least two optical fibers.

16. The optical module according to claim 14,
wherein the wavelength tunable laser further comprises, in addition to the plurality of emitting ports, from which the laser beams to be introduced to the optical detector are output, a second emitting port from which a laser beam of a wavelength that is the same as the same wavelength of the laser beams, and
wherein the laser beam emitted from the second emitting port is output to the outside as the output from the optical module.

* * * * *